(12) United States Patent
Matsumoto et al.

(10) Patent No.: US 10,265,955 B2
(45) Date of Patent: Apr. 23, 2019

(54) LIQUID DISCHARGE APPARATUS

(71) Applicant: SEIKO EPSON CORPORATION, Tokyo (JP)

(72) Inventors: Yusuke Matsumoto, Nagano (JP); Toru Matsuyama, Nagano (JP)

(73) Assignee: Seiko Epson Corporation, Tokyo (JP)

(*) Notice: Subject to any disclaimer, the term of this patent is extended or adjusted under 35 U.S.C. 154(b) by 51 days.

(21) Appl. No.: 15/714,110

(22) Filed: Sep. 25, 2017

(65) Prior Publication Data

US 2018/0086075 A1    Mar. 29, 2018

(30) Foreign Application Priority Data

Sep. 29, 2016  (JP) ................. 2016-191274

(51) Int. Cl.
  *B41J 2/025*  (2006.01)
  *B41J 2/045*  (2006.01)
  (Continued)

(52) U.S. Cl.
CPC ........... *B41J 2/14209* (2013.01); *B41J 2/025* (2013.01); *B41J 2/04541* (2013.01); *B41J 2/04563* (2013.01); *B41J 2/04581* (2013.01); *B41J 2/04588* (2013.01); *B41J 2/04591* (2013.01); *B41J 2/04593* (2013.01);
(Continued)

(58) Field of Classification Search
CPC .... B41J 2/025; B41J 2/04541; B41J 2/04563; B41J 2/04581; B41J 2/04588; B41J 2/04591; B41J 2/14153; B41J 2/14209; B41J 2/14233; B41J 2/14274; B41J 2002/14217; B41J 2002/14491; H05K 1/0218; H05K 1/0219; H05K 1/0298; Y10T 29/49124
See application file for complete search history.

(56) References Cited

U.S. PATENT DOCUMENTS 5,003,273 A * 3/1991 Oppenberg ............. H01P 3/088
                                          174/117 FF
6,483,713 B2 * 11/2002 Samant .................. H01J 47/001
                                          174/250
(Continued)

FOREIGN PATENT DOCUMENTS

JP    2007-181983 A    7/2007
JP    2016-049691 A    4/2016
JP    2016-093973 A    5/2016

*Primary Examiner* — Anh T Vo

(57) ABSTRACT

A liquid discharge apparatus includes a liquid discharge head including a head module provided with a discharge section configured to be driven by a drive signal and discharge a liquid and a supply section configured to supply the drive signal to the discharge section in accordance with a designation signal for designating an operation in the discharge section, and a state signal output section configured to output a state signal, and a wire section including a first wire to which the state signal is supplied, a second wire configured to supply the designation signal, and a third wire configured to supply the drive signal. The first wire includes a first shielding layer containing a conductive material, a second shielding layer containing a conductive material, and a first conductor provided between the first shielding layer and the second shielding layer, the first conductor being configured to transmit the state signal.

8 Claims, 10 Drawing Sheets

(51) Int. Cl.
*B41J 2/14* (2006.01)
*H05K 1/02* (2006.01)

(52) U.S. Cl.
CPC ........ *B41J 2/14233* (2013.01); *H05K 1/0218* (2013.01); *H05K 1/0219* (2013.01); *H05K 1/0298* (2013.01); *B41J 2/14153* (2013.01); *B41J 2/14274* (2013.01); *B41J 2002/14217* (2013.01); *B41J 2002/14491* (2013.01); *Y10T 29/49124* (2015.01)

(56) References Cited

U.S. PATENT DOCUMENTS

| | | | |
|---|---|---|---|
| 6,886,914 B2 * | 5/2005 | Hiramoto | B41J 2/14274 174/117 F |
| 8,449,321 B2 * | 5/2013 | Raybold | H01R 12/7088 439/540.1 |
| 9,440,440 B2 | 9/2016 | Date | |

* cited by examiner

FIG. 7

| Sd[m] | CONTENT DESIGNATED BY Sd[m] | SLa[m] | | SLb[m] | | | SLs[m] | | |
|---|---|---|---|---|---|---|---|---|---|
| | | Ts1 | Ts2 | TSS1 | TSS2 | TSS3 | TSS1 | TSS2 | TSS3 |
| (1,1,0) | LARGE DOT | H | H | L | L | L | L | L | L |
| (1,0,0) | MEDIUM DOT | H | L | L | L | L | L | L | L |
| (0,1,0) | SMALL DOT | L | H | L | L | L | L | L | L |
| (0,0,0) | NON-RECORD | L | L | L | L | L | L | L | L |
| (1,1,1) | DETERMINATION TARGET | L | L | H | L | H | L | H | L |

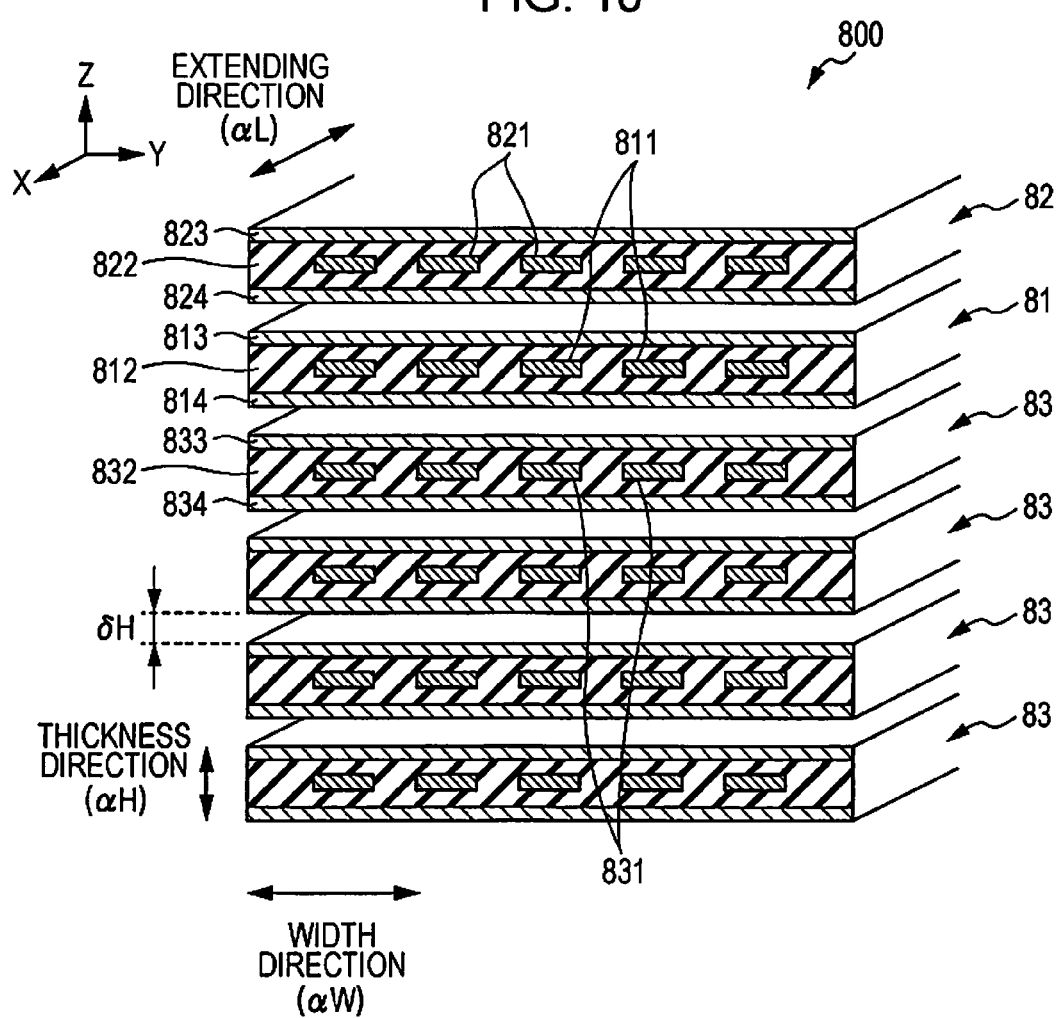

LIQUID DISCHARGE APPARATUS

This application claims priority to Japanese Patent Application No. 2016-191274 filed on Sep. 29, 2016. The entire disclosure of Japanese Patent Application No. 2016-191274 is hereby incorporated herein by reference.

BACKGROUND

1. Technical Field

The present invention relates to a liquid discharge apparatus.

2. Related Art

Liquid discharge apparatuses such as an ink jet printer perform print processing by driving discharge sections in a liquid discharge head and discharging liquid such as ink contained in cavities of the discharge sections to form an image on a recording medium. Such a liquid discharge apparatus typically supplies a drive signal for driving discharge sections to a liquid discharge head via a wire such as a flexible flat cable (FFC) (see JP-A-2016-093973). Some liquid discharge apparatuses detect residual vibrations generated in a discharge section that has been driven by a drive signal, and based on the residual vibrations, determine whether the liquid discharge state in the discharge section is normal. Such a liquid discharge apparatus acquires a residual vibration signal that indicates residual vibrations generated in a discharge section from a liquid discharge head via a wire such as an FFC, and based on the residual vibration signal, determines the liquid discharge state in the discharge section (see JP-A-2016-049691). In such liquid discharge apparatuses, a head module, which is provided with discharge sections and a supplying section for supplying a drive signal to the discharge sections, is heated, and in some cases, due to overheating, the liquid is not discharged normally from the discharge sections. To solve the problem, whether or not the head module is overheated is determined on the basis of the overheating notification signal, which is acquired from a liquid discharge head via a wire such as an FFC, that indicates whether the temperature of the head module is a reference temperature or higher (see JP-A-2007-181983). As described above, in a liquid discharge apparatus, the state of a head module may be determined by acquiring a state signal indicating the state of the head module such as a residual vibration signal or an overheating notification signal from the head module via a wire such as an FFC.

Generally, such a drive signal has a large amplitude. Accordingly, in supplying a drive signal to a liquid discharge head, noise caused by the drive signal may be superimposed on a state signal acquired from the liquid discharge head. The noise-superimposed state signal makes it difficult to keep track of the state of the head module and to appropriately determine the state of the head module.

SUMMARY

An advantage of some aspects of the invention is that there is provided a technique for reducing the influence of the noise caused by a drive signal on a state signal.

To solve the problem, a liquid discharge apparatus according to an aspect of the invention includes a liquid discharge head including a head module provided with a discharge section configured to be driven by a drive signal and discharge a liquid and a supply section configured to supply the drive signal to the discharge section in accordance with a designation signal for designating an operation in the discharge section, and a state-signal output section configured to output a state signal indicating a state of the head module, and a wire section including a first wire to which the state signal is supplied from the liquid discharge head, a second wire configured to supply the designation signal to the liquid discharge head, and a third wire configured to supply the drive signal to the liquid discharge head. The first wire includes a first shielding layer containing a conductive material, a second shielding layer containing a conductive material, and a first conductor provided between the first shielding layer and the second shielding layer, the first conductor being configured to transmit the state signal.

According to this aspect, a first wire to which a state signal is supplied is a double-sided shield type wire. Accordingly, even if the first wire, a second wire, and a third wire are stacked in a thickness direction of each wire in a wire section and the adjacent wires are stacked with a reduced interval in the thickness direction of each wire, superimposition of the noise caused by a drive signal or the like on the state signal can be prevented.

In this liquid discharge apparatus, the first shielding layer may be provided between the first conductor and the second wire in the wire section, and the second shielding layer may be provided between the first conductor and the third wire in the wire section.

In this case, the first shielding layer may be provided between the first conductor and the second wire, and consequently, superimposition of the noise caused by the designation signal supplied to the second wire on the state signal can be prevented. Furthermore, in this case, the second shielding layer may be provided between the first conductor and the third wire, and consequently, superimposition of the noise caused by the drive signal supplied to the third wire on the state signal can be prevented. Furthermore, in this case, the first shielding layer and the second shielding layer may be provided between the second wire and the third wire, and consequently, superimposition of the noise caused by the drive signal supplied to the third wire on the state signal supplied to the second wire can be prevented.

In this liquid discharge apparatus, the state signal may include a residual vibration signal indicating residual vibrations occurring in the discharge section driven by the drive signal.

In this case, the liquid-discharge state in the discharge section can be determined in accordance with the residual vibration signal.

In this liquid discharge apparatus, the state signal may include an overheating-notification signal indicating whether or not the temperature of the head module at a predetermined position is a reference temperature or higher.

In this case, whether or not the head module is in an overheated state can be determined in accordance with the overheating-notification signal.

In this liquid discharge apparatus, the second wire may include a third shielding layer containing a conductive material, a fourth shielding layer containing a conductive material, and a second conductor provided between the third shielding layer and the fourth shielding layer, the second conductor being configured to transmit the designation signal.

In this case, the second wire to which the state signal is supplied is a double-sided shield type wire. Accordingly, superimposition of the noise caused by the drive signal or the like on the state signal can be prevented.

In this liquid discharge apparatus, the third wire may include a fifth shielding layer containing a conductive material, a sixth shielding layer containing a conductive material, and a third conductor provided between the fifth shielding layer and the sixth shielding layer, the third conductor being configured to transmit the drive signal.

In this case, the third wire to which the drive signal is supplied is a double-sided shield type wire. Accordingly, propagation of the noise caused by the drive signal or the like to the first wire and/or the second wire can be prevented.

This liquid discharge apparatus may include a controller configured to control the liquid discharge head. The liquid discharge head includes a characteristic-information storage unit configured to store characteristic information indicating characteristics of the liquid discharge head, and the controller references the characteristic information stored in the characteristic-information storage unit via the first wire.

In this case, in accordance with the characteristic information, the head module can be driven and a discharge state of the head module can be determined while the characteristics of the head module are considered. The characteristic information includes, for example, information indicating characteristics of the individual liquid discharge head such as information concerning a manufacturing error and information indicating a usage state or a usage history of the liquid discharge head.

In this liquid discharge apparatus, in the wire section, the distance between the liquid discharge head and the third wire may be shorter than the distance between the liquid discharge head and the first wire.

In this case, superimposition of the noise caused by driving the liquid discharge head on the state signal can be prevented.

BRIEF DESCRIPTION OF THE DRAWINGS

The invention will be described with reference to the accompanying drawings, wherein like numbers reference like elements.

FIG. 7 illustrates a relationship among print signals and connection-state designating signals.

FIG. 10 illustrates an arrangement and structure of FFCs.

DESCRIPTION OF EXEMPLARY EMBODIMENTS

Figure 1:
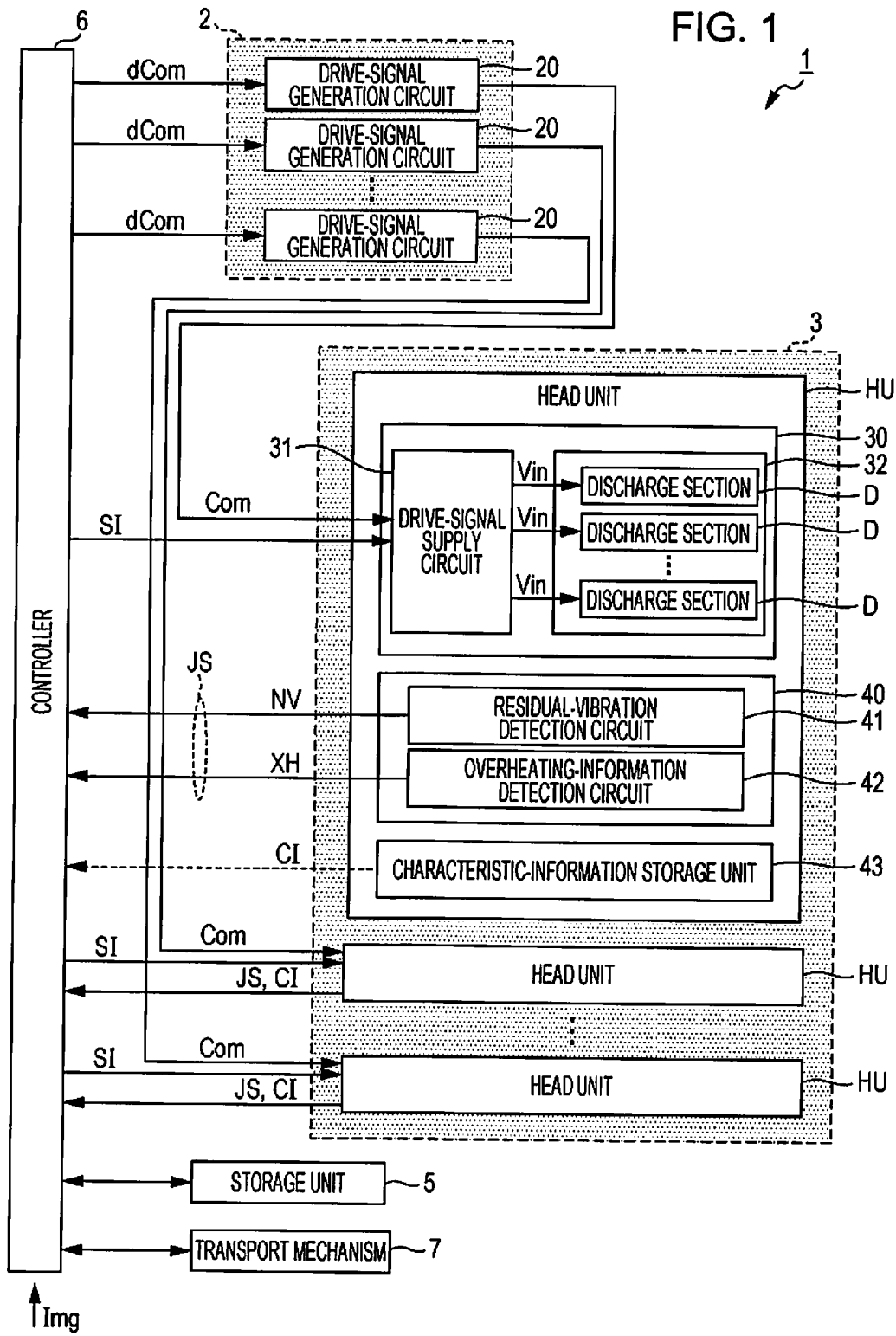
FIG. 1 is a block diagram of an ink jet printer according to an embodiment of the invention.

Hereinafter, embodiments of the invention will be described with reference to the drawings. In the drawings, the size and scaling ratio of each section are appropriately changed from those of actual sections. Although various technically preferred limitations are given in the embodiments described below in order to illustrate specific preferred examples of the invention, it should be noted that the scope of the invention is not intended to be limited to the embodiments unless such limitations are explicitly mentioned hereinafter.

A. Embodiment

As an example liquid discharge apparatus, this embodiment uses an ink jet printer that forms an image on recording paper P, which is an example "recording medium", by discharging ink, which is an example "liquid".

1. Outline of Ink Jet Printer

Figure 2:
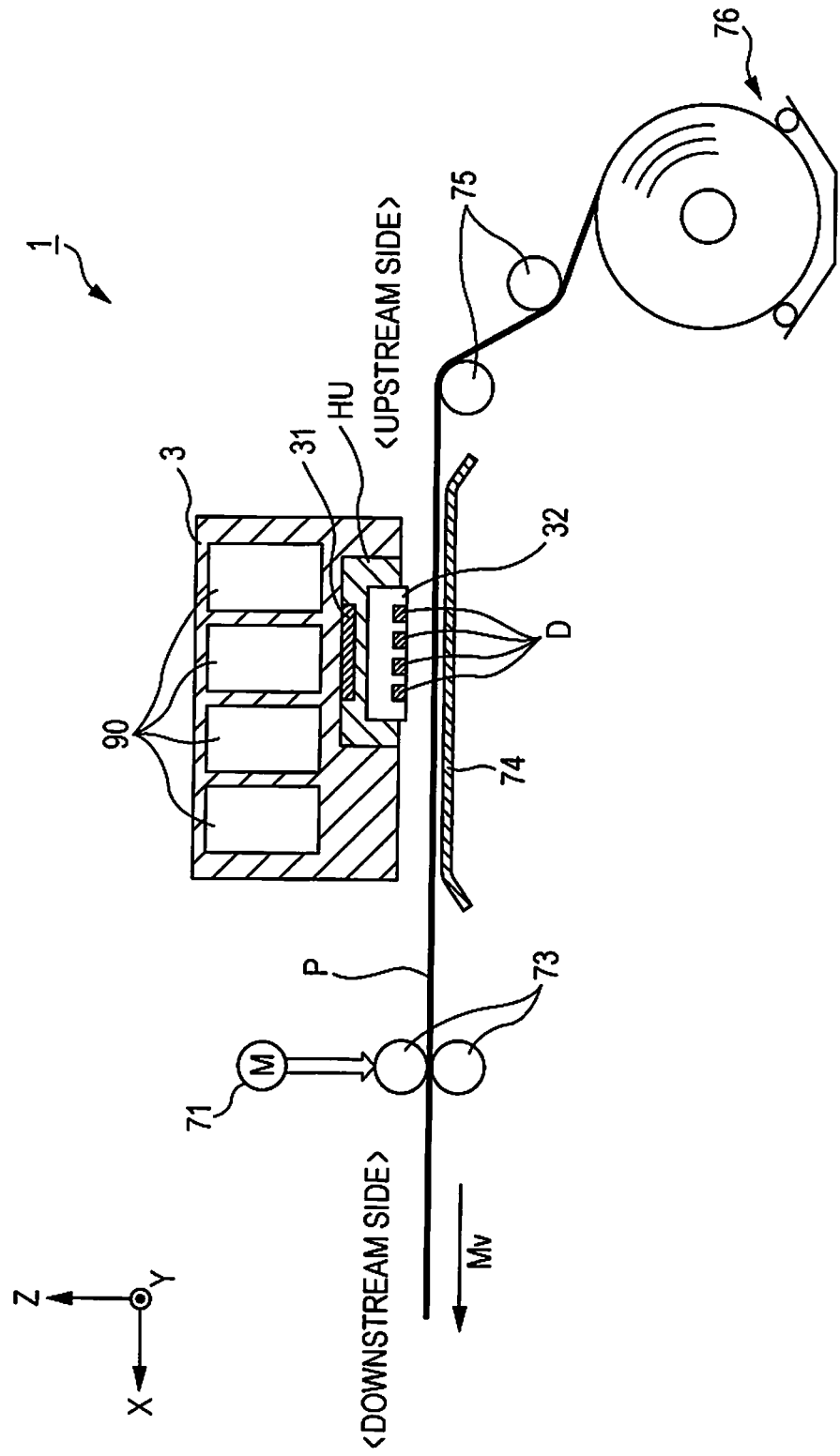
FIG. 2 is a partial sectional view schematically illustrating an inner structure of the ink jet printer.

With reference to FIG. 1 and FIG. 2, an ink jet printer 1 according to the embodiment will be described. FIG. 1 is a functional block diagram of the ink jet printer 1 according to the embodiment. FIG. 2 is a partial sectional view schematically illustrating an inner structure of the ink jet printer 1.

Print data Img that represents an image to be formed by the ink jet printer 1 is supplied to the ink jet printer 1 from a host computer (not illustrated) such as a personal computer, a digital camera, or the like. The ink jet printer 1 performs print processing for forming on recording paper P the image represented by the print data Img, which is supplied from the host computer. Although details will be described below, in this embodiment, it is assumed that the ink jet printer 1 is a line printer.

As illustrated in FIG. 1, the ink jet printer 1 includes a liquid discharge head 3, a controller 6, a drive-signal generation module 2 that has drive-signal generation circuits 20, a transport mechanism 7, and a storage unit 5. The liquid discharge head 3 includes head units HU that have discharge sections D for discharging ink. The controller 6 controls operations of the components in the ink jet printer 1. Each drive-signal generation circuit 20 generates a drive signal Com for driving the discharge sections D. The transport mechanism 7 changes a position of the recording paper P relative to the liquid discharge head 3. The storage unit 5 stores a control program for the ink jet printer 1 and other information. As an example, in this embodiment, it is assumed that the liquid discharge head 3 includes four head units HU, and the drive-signal generation module 2 includes four drive-signal generation circuits 20 each of which corresponds to a respective head unit HU.

In this embodiment, each head unit HU is provided with a head module 30 that has a discharge module 32, which has M discharge sections D, and a drive signal supply circuit 31 (an example of a "supply section") that supplies the drive signal Com, which has been output by the drive-signal generation module 2, to the discharge module 32 (in this embodiment, M is a natural number that satisfies $1 \le M$). In the description below, in order to distinguish each of the M discharge sections D provided in each discharge module 32 from each other, the discharge sections D may be referred to as a first stage, a second stage, . . . , M stage in order. The discharge section D in the m stage may be referred to as a discharge section D[m] (m is a natural number that satisfies $1 \le m \le M$). A component, signal, and the like in the ink jet printer 1 that correspond to the number of the stage m of the discharge section D[m] may be expressed with a subscript [m] added to indicate that the component, signal, and the like correspond to the number of the stage m.

In this embodiment, each head unit HU includes a state-signal output section 40, which outputs a state signal JS that indicates a state of the head module 30, and a temperature sensor (not illustrated). The temperature sensor detects the temperature at a predetermined position in the head module 30 and outputs temperature information that indicates a detection result. The state-signal output section 40 includes a residual-vibration detection circuit 41 and an overheating-information detection circuit 42.

The residual-vibration detection circuit 41 outputs, in accordance with a detected detection signal Vout[m] from the discharge section D[m] that has been driven by the drive signal Com, a residual-vibration signal NV[m] that indicates residual vibrations remaining in the discharge section D[m] after the discharge section D[m] has been driven. The overheating-information detection circuit 42 outputs an overheating-notification signal XH that indicates whether the temperature indicated by the temperature information that has been output by the temperature sensor is a predetermined reference temperature or higher. In other words, in this embodiment, it is assumed that the state signal JS includes the residual-vibration signal NV and the overheating-notification signal XH.

In this embodiment, each head unit HU includes a characteristic-information storage unit 43 that stores characteristic information CI that indicates characteristics of the head module 30. The characteristic information CI indicates characteristics of each individual head module 30. The characteristic information CI includes, for example, at least one of the information concerning production of the head module 30, such as the serial number and the production date of the head module 30, information concerning a manufacturing error of the head module 30 that is detected in the manufacturing process of the head module 30 or the like, and information indicating a usage history of the head module 30. The controller 6 accesses the characteristic-information storage unit 43 to refer to the characteristic information stored in the characteristic-information storage unit 43.

The storage unit 5 includes, for example, a volatile memory such as a random access memory (RAM) and a nonvolatile memory such as a read-only memory (ROM), electrically erasable programmable read-only memory (EEPROM), or a programmable ROM (PROM). The storage unit 5 stores various kinds of information such as the print data Img, which is supplied from a host computer, and a control program for the ink jet printer 1.

The controller 6 includes a central processing unit (CPU). Alternatively, instead of a CPU or in addition to a CPU, the controller 6 may include a programmable logic device such as a field-programmable gate array (FPGA). The controller 6 controls each component in the ink jet printer 1 by enabling a control program that is stored in the storage unit 5 to be run by the CPU in the controller 6. Specifically, the controller 6 generates a print signal SI for controlling each drive signal supply circuit 31, which is provided in the liquid discharge head 3, a waveform-designating signal dCom for controlling each drive-signal generation circuit 20, which is provided in the drive-signal generation module 2, and a signal for controlling the transport mechanism 7. The waveform-designating signal dCom is a digital signal for designating a waveform of a drive signal Com. The drive signal Com is an analog signal for driving the discharge sections D. The drive-signal generation circuit 20 includes a digital-to-analog (D/A) conversion circuit and generates the drive signal Com that has the waveform designated by the waveform-designating signal dCom. In this embodiment, it is assumed that the drive signal Com includes a drive signal Com-A and a drive signal Com-B. The print signal SI is a digital signal for designating the type of operation of the discharge sections D. Specifically, the print signal SI designates whether or not to supply the drive signal Com to the discharge sections D to designate the type of operation of the discharge sections D. Designating the type of operation of the discharge sections D includes, for example, designating whether or not to drive the discharge sections D, designating whether or not to discharge ink from the discharge sections D when the discharge sections D are driven, and designating amounts of ink to be discharged from the discharge sections D when the discharge sections D are driven.

To perform print processing, the controller 6 instructs the storage unit 5 to store the print data Img supplied from a host computer. Then, in accordance with the various kinds of data stored in the storage unit 5 such as the print data Img, the controller 6 generates various control signals such as the print signal SI, the waveform-designating signal dCom, and the signal for controlling the transport mechanism 7. In accordance with the control signals and the various kinds of data stored in the storage unit 5, the controller 6 controls the transport mechanism 7 such that the relative position of the recording paper P with respect to the liquid discharge head 3 is changed and controls the liquid discharge head 3 such that the discharge sections D are driven. With these operations, the controller 6 determines whether or not to discharge ink from the discharge sections D, the discharge amount of ink, the timing for discharging the ink, and the like to control the print processing for forming an image corresponding to the print data Img on the recording paper P.

The controller 6 determines, before or during the print processing, whether the temperature of the head module 30 is at a predetermined reference temperature or higher in accordance with an overheating-notification signal XH output by the overheating-information detection circuit 42. In other words, the controller 6 can determine whether the head module 30 is in an overheated state. If the head module 30 is in an overheated state, the controller 6 can stop the print processing until the temperature of the head module 30 decreases to a temperature lower than the reference temperature.

The ink jet printer 1 according to the embodiment can perform a discharge-state determining process that includes a determination-preparation process and a discharge-state determining process. The discharge-state determining process is a process for determining a discharge state of the ink in the discharge section D[m] and is performed by the controller 6 in accordance with the residual-vibration signal NV[m] that indicates residual vibrations being produced in the discharge section D[m]. The determination-preparation process includes various preparation processes for performing the discharge-state determining process. Specifically, the determination-preparation process includes a process for selecting a discharge section D[m] (hereinafter, a discharge section D that is a target for the determination in the discharge-state determining process may be referred to as a determination-target discharge section D-H) that is to be a target for the discharge-state determining process, a process for driving the discharge section D[m] that has been selected as the determination-target discharge section D-H by applying the drive signal Com, a process for detecting a detection signal Vout[m] from the discharge section D[m] that has been driven by the drive signal Com, and a process for generating a residual-vibration signal NV[m] in accordance with the detection signal Vout[m].

The ink jet printer 1 according to the embodiment performs, in the discharge-state determining process, a series of processes consisting of a first process for selecting a determination-target discharge section D-H from M discharge sections D in each head unit HU performed by the controller 6, a second process for driving the discharge section D[m] that has been selected as the determination-target discharge section D-H to produce residual vibrations in the discharge section D[m] under the control of the controller 6, a third process for detecting a detection signal Vout[m] that indicates the residual vibrations being produced in the discharge section D[m] performed by the residual-vibration detection circuit 41, a fourth process for generating a residual-vibration signal NV[m] in accordance with the detection signal Vout[m] performed by the residual-vibration detection circuit 41, and a fifth process for determining whether the ink-discharge state in the discharge section D[m], which has been selected as the determination-target discharge section D-H, is normal performed by the controller 6, that is, whether a discharge abnormality is not occurring in the discharge section D[m]. Among the first to fifth processes, the first to fourth processes correspond to the determination-preparation process, and the fifth process corresponds to the discharge-state determining process.

A discharge abnormality is a state in which the discharge section D cannot discharge an ink in accordance with a drive signal Com even though the drive signal Com is supplied to drive the discharge section D to discharge the ink from the discharge section D. The ink discharge in accordance with the drive signal Com is discharge, by the discharge section D, of an ink in an amount defined by the waveform of the drive signal Com at a discharge speed defined by the waveform of the drive signal Com. In other words, the state in which the discharge section D cannot discharge the ink in accordance with the drive signal Com includes, in addition to the state in which the discharge section D cannot discharge the ink, a state in which the discharge section D discharges the ink in an amount different from that defined by the drive signal Com and a state in which the discharge section D discharges the ink at a speed different from that defined by the drive signal Com, and as a result, the discharge section D cannot discharge the ink to desired positions on recording paper P.

FIG. 2 is a partial sectional view schematically illustrating an inner structure of the ink jet printer 1. As illustrated in FIG. 2, in this embodiment, it is assumed that the ink jet printer 1 is provided with four ink cartridges 90. In FIG. 2, the ink cartridges 90 are provided in the liquid discharge head 3; however, the ink cartridges 90 may be provided at other locations in the ink jet printer 1. These four ink cartridges 90 correspond to four respective colors of cyan, magenta, yellow, and black (CMYK). Each ink cartridge 90 is filled with an ink of a color correspondingly assigned to the ink cartridge 90.

As illustrated in FIG. 2, the transport mechanism 7 includes a transporting motor 71, a motor driver (not illustrated), a platen 74, transport rollers 73, guide rollers 75, and a storage section 76. The transporting motor 71 is a drive source for transporting the recording paper P, and the motor driver drives the transporting motor 71. The platen 74 is disposed below (−Z direction in FIG. 2) the liquid discharge head 3. The transport rollers 73 are rotated when the transporting motor 71 operates. The guide rollers 75 are rotatable about the Y-axes in FIG. 2, respectively. The storage section 76 stores the recording paper P in a state in which the recording paper P is wound in a rolled state. When the ink jet printer 1 performs print processing, the transport mechanism 7 feeds the recording paper P from the storage section 76 and transports the recording paper P in the +X direction (the direction from the upstream side toward the downstream side (hereinafter, may be referred to as a "transport direction Mv")) in the drawing along a transport path that is defined by the guide rollers 75, the platen 74, and the transport rollers 73. In the description below, as illustrated in FIG. 2, the +X direction (transport direction Mv) and the opposing −X direction are collectively referred to as the X-axis direction, the +Z direction (upward direction) and the opposing −Z direction (downward direction) are collectively referred to as the Z-axis direction, and the +Y direction that intersects the X-axis direction and the Z-axis direction and the opposing −Y direction are collectively referred to as the Y-axis direction.

To each of the 4M discharge sections D provided in the liquid discharge head 3, an ink is supplied from one of the four ink cartridges 90. Each discharge section D can store the ink supplied from the ink cartridge 90 therein and discharge the stored ink from nozzles N (see FIG. 3) that are provided in the discharge section D. Specifically, while the transport mechanism 7 transports the recording paper P on the platen 74, each discharge section D discharges the ink onto the recording paper P to form dots that constitute an image. From the 4M discharge sections D that are provided in the four head units HU in the liquid discharge head 3, the inks of the four CMYK colors are discharged, and thereby full color printing is performed.

2. Overview of Discharge Module and Discharge Section

Figure 3:
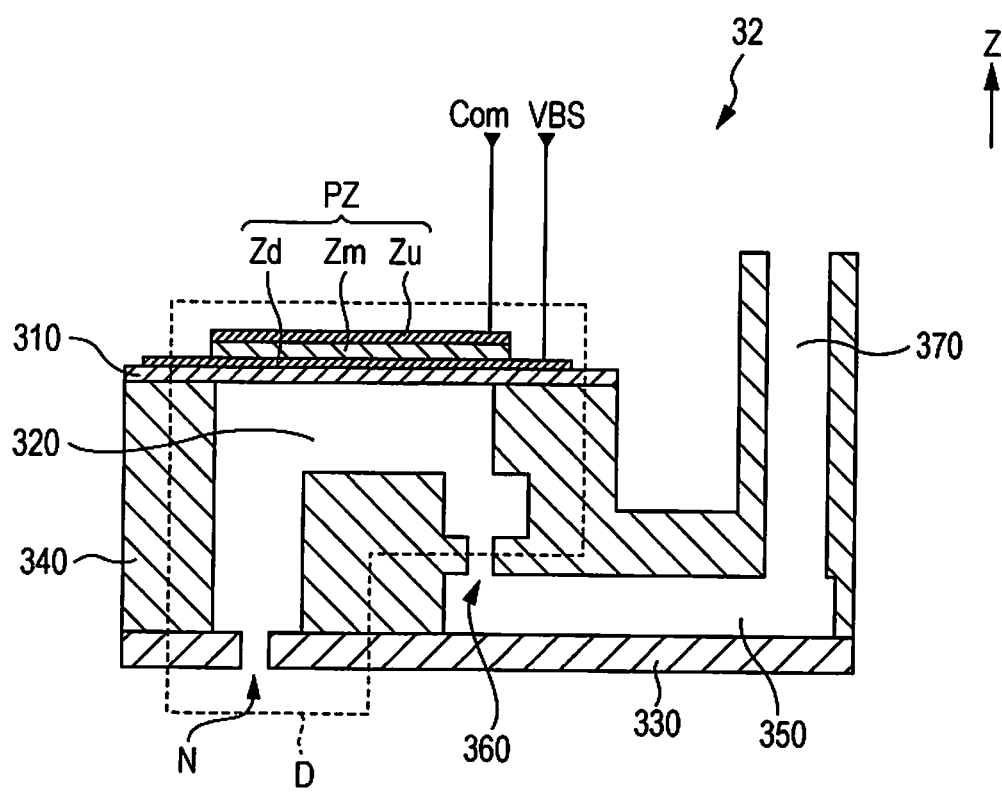
FIG. 3 illustrates a structure of a discharge section.
Figure 4:
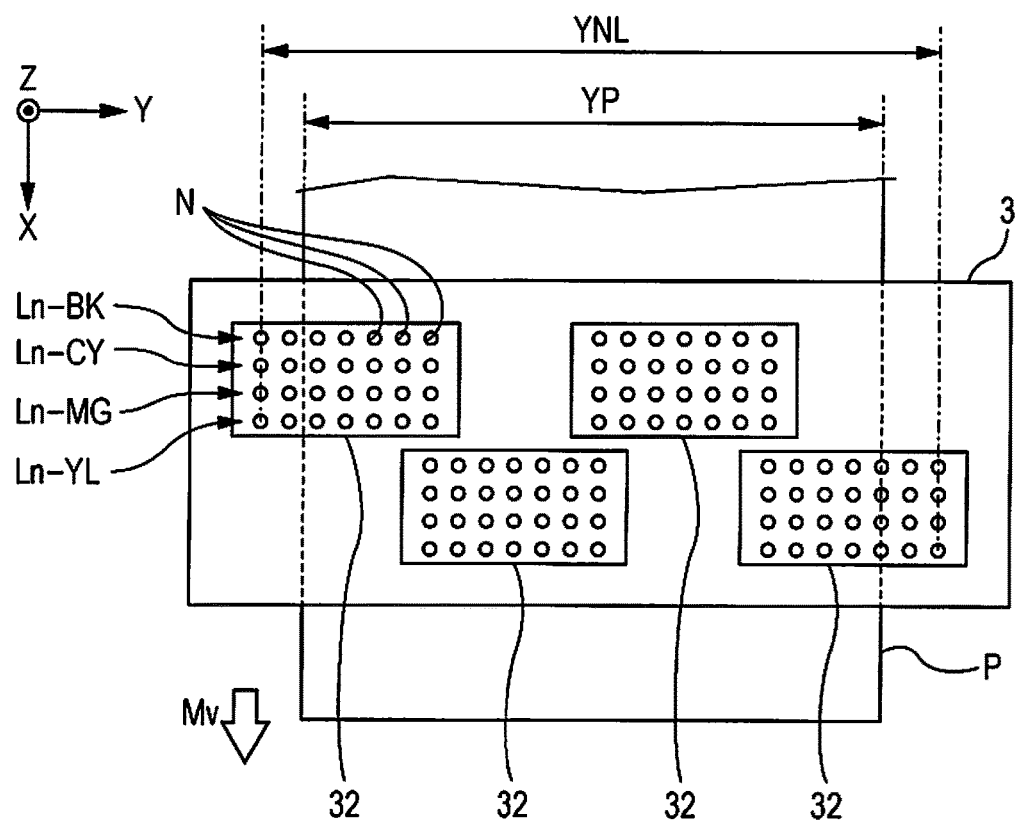
FIG. 4 is a plan view of an arrangement of nozzles on a liquid discharge head.

With reference to FIG. 3 and FIG. 4, the discharge module 32 and the discharge section D provided in the discharge module 32 will be described.

FIG. 3 is a partial sectional view schematically illustrating the discharge module 32 in which the discharge module 32 is cut such that the discharge section D is included. As illustrated in FIG. 3, the discharge section D has a piezoelectric element PZ, a cavity 320 that is filled with an ink, the nozzle N that communicates with the cavity 320, and a diaphragm 310. The cavity 320 is a space defined by a cavity plate 340, a nozzle plate 330 in which the nozzle N is formed, and the diaphragm 310. The cavity 320 communicates with a reservoir 350 via an ink supply port 360. The reservoir 350 communicates with the ink cartridge 90 that corresponds to the discharge section D via an ink inlet 370. The piezoelectric element PZ includes an upper electrode Zu, a lower electrode Zd, and a piezoelectric body Zm that is provided between the upper electrode Zu and the lower electrode Zd. The lower electrode Zd is electrically connected to a feed wire LHd (see FIG. 5) that is set to a potential VBS. When the drive signal Com is supplied to the upper electrode Zu, a voltage is applied between the upper electrode Zu and the lower electrode Zd, and thereby the piezoelectric element PZ deforms in the +Z direction or the −Z direction in accordance with the applied voltage. This embodiment uses a unimorph (monomorph) type piezoelectric element PZ as illustrated in FIG. 3. It should be noted that the piezoelectric element PZ is not limited to the unimorph type, and alternatively, a bimorph type piezoelectric element, a stacked piezoelectric element, or the like may be used. The diaphragm 310 is disposed on an upper opening of the cavity plate 340. On the diaphragm 310, the lower electrode Zd is bonded. Accordingly, when the piezoelectric element PZ is driven by the drive signal Com and deformed, the diaphragm 310 deforms. The deformation of the diaphragm 310 changes the volume of the cavity 320, and thereby the ink stored in the cavity 320 is discharged from the nozzle N. The ink in the cavity 320 that has been discharged is refilled from the reservoir 350.

FIG. 4 illustrates an example arrangement of the four discharge modules 32 in the liquid discharge head 3 and the 4M nozzles N in the four discharge modules 32 in the ink jet printer 1 viewed in the Z-axis direction from the +Z direction side in plan view. As illustrated in FIG. 4, each discharge module 32 in the liquid discharge head 3 has nozzle arrays Ln. The nozzle array Ln includes a plurality of nozzles N that are arranged in a line so as to extend in a predetermined direction. In this embodiment, as an example, it is assumed that each discharge module 32 has four nozzle arrays Ln including a nozzle array Ln-BK, a nozzle array Ln-CY, a nozzle array Ln-MG, and a nozzle array Ln-YL. The nozzles N in the nozzle array Ln-BK are provided in the discharge section D that discharges a black ink, the nozzles N in the nozzle array Ln-CY are provided in the discharge section D that discharges a cyan ink, the nozzles N in the nozzle array Ln-MG are provided in the discharge section D that discharges a magenta ink, and the nozzles N in the nozzle array Ln-YL are provided in the discharge section D that discharges a yellow ink. Furthermore, in this embodiment, as an example, it is assumed that each of the four nozzle arrays Ln in each discharge module 32 extends in the Y-axis direction in plan view.

As illustrated in FIG. 4, the liquid discharge head 3 according to this embodiment is a so-called line head. In other words, a range YNL of the 4M nozzles N in the liquid discharge head 3 in the Y-axis direction covers a range YP of the recording paper P in the Y-axis direction when the ink jet printer 1 performs print processing onto the recording paper P (to be exact, the recording paper P that has a maximum width corresponding to a maximum width in which the ink jet printer 1 can print in the Y-axis direction).

In this embodiment, the range YP is a range that has a width of 297 mm or greater. In other words, the line head (the liquid discharge head 3) in the ink jet printer 1 according to the embodiment has a size the ink jet printer 1 can perform printing onto A4-size landscape-oriented recording paper P. Furthermore, in this embodiment, it is assumed that the liquid discharge head 3 has the nozzles N that are arrayed so as to enable printing at a dot density of 600 dpi or greater.

It should be noted that the arrangement of the four discharge modules 32 in the liquid discharge head 3 and the arrangement of the nozzle arrays Ln in each discharge module 32 are only examples. In each liquid discharge head 3, the discharge modules 32 and the nozzle arrays Ln may be provided in any arrangement. For example, in FIG. 4, the nozzle arrays Ln extend in the Y-axis direction; alternatively, the nozzle arrays Ln may be provided so as to extend in a predetermined direction within the XY plane. For example, the nozzle arrays Ln may be provided so as to extend in a direction different from the Y-axis direction and the X-axis direction, such as an oblique direction in the drawing. Furthermore, in FIG. 4, the four nozzle arrays Ln are provided in each discharge module 32; alternatively, one or more nozzle arrays Ln may be provided in each discharge module 32. Furthermore, in FIG. 4, the plurality of nozzles N constituting each nozzle array Ln are arranged in a line in the Y-axis direction; alternatively, positions of the even-numbered nozzles N and the odd-numbered nozzles N from the −Y side may be different from each other in the X-axis direction, that is, the nozzles N may be provided in a so-called staggered arrangement.

3. Configuration of Head Module

Hereinafter, a configuration of each head module 30 will be described with reference to FIG. 5.

Figure 5:
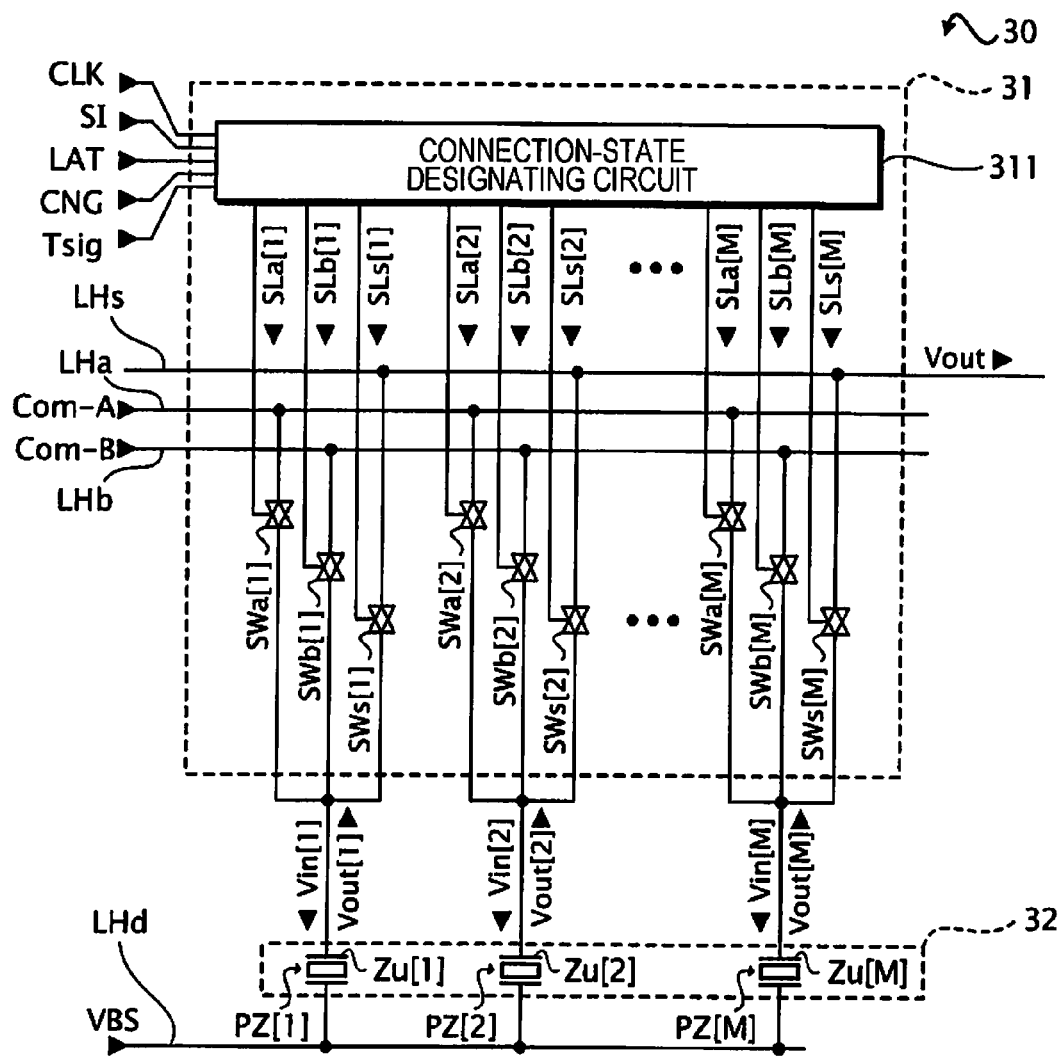
FIG. 5 is a block diagram illustrating a configuration of a head module.

FIG. 5 is a block diagram illustrating a configuration of the head module 30. As described above, the head module 30 includes the drive signal supply circuit 31 and the discharge module 32. The head module 30 also includes an internal wire LHa to which the drive signal Com-A is supplied from the drive-signal generation module 2, an internal wire LHb to which the drive signal Com-B is supplied from the drive-signal generation module 2, and an internal wire LHs for supplying a detected detection signal Vout from the discharge section D to the residual-vibration detection circuit 41.

As illustrated in FIG. 5, the drive signal supply circuit 31 includes M switches SWa (SWa[1] to SWa[M]), M switches SWb (SWb[1] to SWb[M]), M switches SWs (SWs[1] to SWs[M]), and a connection-state designating circuit 311 for designating a connection state of each switch. Each switch may be, for example, a transmission gate. The connection-state designating circuit 311 generates connection-state designating signals SLa[1] to SLa[M] for designating on or off of the switches SWa[1] to SWa[M], connection-state designating signals SLb[1] to SLb[M] for designating on or off of the switches SWb[1] to SWb[M], and connection-state designating signals SLs[1] to SLs[M] for designating on or off of the switches SWs[1] to SWs[M], in accordance with at least one of the print signal SI, a latch signal LAT, a change signal CNG, and a period designating signal Tsig, which are supplied from the controller 6. The switch SWa[m] switches between conduction and non-conduction between the internal wire LHa and the upper electrode Zu[m] of the piezoelectric element PZ[m], which is provided in the discharge section D[m], in accordance with the connection-state designating signal SLa[m]. For example, the switch SWa[m] is turned on when the connection-state designating signal SLa[m] is at a high level and is turned off at a low level. The switch SWb[m] switches between conduction and non-conduction between the internal wire LHb and the upper electrode Zu[m] of the piezoelectric element PZ[m], which is provided in the discharge section D[m], in accordance with the connection-state designating signal SLb[m]. For example, the switch SWb[m] is turned on when the connection-state designating signal SLb[m] is at a high level and is turned off at a low level. In the drive signals Com-A and Com-B, a signal that is actually supplied to the piezoelectric element PZ[m] in the discharge section D[m] via the switch SWa[m] or SWb[m] may be referred to as a supply-drive signal Vin[m]. The switch SWs[m] switches between conduction and non-conduction between the internal wire LHs and the upper electrode Zu[m] of the piezoelectric element PZ[m], which is provided in the discharge section D[m], in accordance with the connection-state designating signal SLs[m]. For example, the switch SWs[m] is turned on when the connection-state designating signal SLs[m] is at a high level and is turned off at a low level.

To the residual-vibration detection circuit 41, the detection signal Vout[m] that is output from the piezoelectric element PZ[m] in the discharge section D[m] that has been driven as the determination-target discharge section D-H is supplied via the internal wire LHs. Then, the residual-vibration detection circuit 41 generates the residual-vibration signal NV[m] in accordance with the detection signal Vout[m].

4. Operation of Head Module

Hereinafter, operations of each head module 30 will be described with reference to FIGS. 6 to 8.

In this embodiment, an operation period of the ink jet printer 1 includes one or more unit periods Tu. It is assumed that, in each unit period Tu, the ink jet printer 1 according to the embodiment can perform one of a driving operation of each discharge section D in the print process and a driving operation of the determination-target discharge section D-H and a detecting operation (determination preparation process) of residual vibrations in the discharge-state determining process. Typically, the ink jet printer 1 repeatedly performs the print processing over a plurality of continuous or intermittent unit periods Tu to discharge the ink from each discharge section D one or more times, and thereby an image represented by the print data Img is formed. Furthermore, the ink jet printer 1 according to the embodiment performs the discharge-state determining process on each of M discharge sections D[1] to D[M] as the determination-target discharge section D-H by performing the determination-preparation process M times in continuous or intermittent unit periods Tu.

Figure 6:
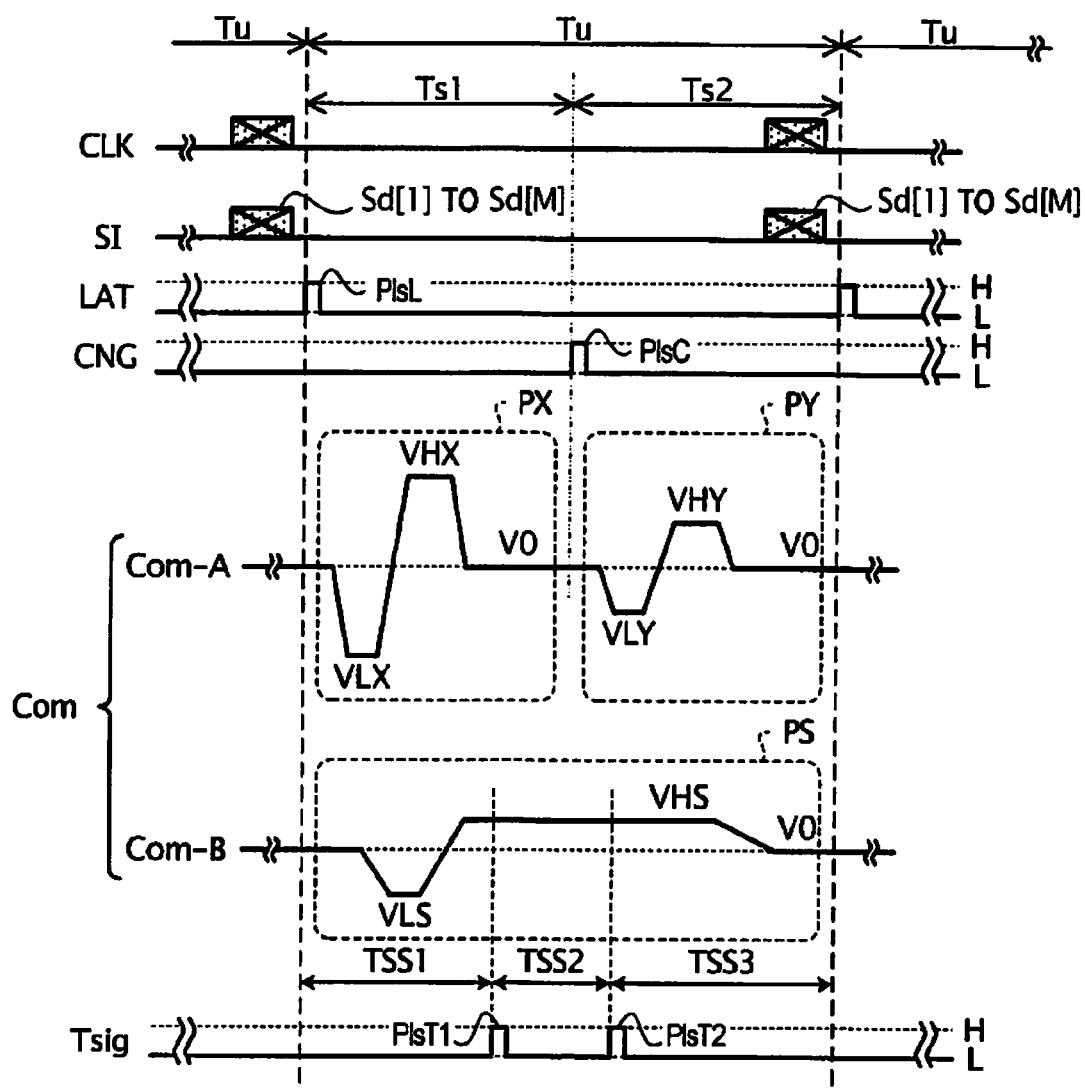
FIG. 6 is a timing chart of operations of the ink jet printer.

FIG. 6 is a timing chart of operations of the ink jet printer 1 in the unit period Tu. As illustrated in FIG. 6, the controller 6 outputs the latch signal LAT that has a pulse PlsL and the change signal CNG that has a pulse PlsC. With these signals, the controller 6 defines a unit period Tu as the period from the rise of the pulse PlsL to the rise of the next pulse PlsL. The controller 6 divides the unit period Tu into a control period Ts1 and a control period Ts2 by the pulse PlsC. The controller 6 outputs the period-designating signal Tsig that has a pulse PlsT1 and a PlsT2 as illustrated in FIG. 6. With these signals, the controller 6 divides the unit period Tu into a control period TSS1 from the start of the pulse PlsL to the start of the pulse PlsT1, a control period TSS2 from the start of the pulse PlsT1 to the start of the pulse PlsT2, and a control period TSS3 from the start of the pulse PlsT2 to the start of the next pulse PlsL. The print signal SI includes individual-designating signals Sd[1] to Sd[M] for designating driving modes of the discharge section D[1] to D[M] in each unit period Tu. Prior to the start of the unit period Tu, the controller 6 supplies the print signal SI, which includes the individual-designating signals Sd[1] to Sd[M], to the connection-state designating circuit 311 in synchronization with a clock signal CLK as illustrated in FIG. 6. In this process, in the unit period Tu, the connection-state designating circuit 311 generates connection-state designating signals SLa[m], SLb[m], and SLs[m] in accordance with the individual-designating signal Sd[m].

As illustrated in FIG. 6, the drive-signal generation circuit 20 outputs the drive signal Com-A that includes a waveform PX that is provided in the control period Ts1 and a waveform PY that is provided in the control period Ts2. In this embodiment, the waveform PX and the waveform PY are determined such that the potential difference between a maximum potential VHX and a minimum potential VLX of the waveform PX is larger than the potential difference between a maximum potential VHY and a minimum potential VLY of the waveform PY. Specifically, to drive the discharge section D[m] by the drive signal Com-A having the waveform PX, the waveform of the waveform PX is determined such that the ink of an amount (medium amount) corresponding to a medium dot is discharged from the discharge section D[m]. Similarly, to drive the discharge section D[m] by the drive signal Com-A having the waveform PY, the waveform of the waveform PY is determined such that the ink of an amount (small amount) corresponding to a small dot is discharged from the discharge section D[m]. The potentials of the waveform PX and the waveform PY at the start and at the end are set to a reference potential V0. Furthermore, the drive-signal generation circuit 20 outputs the drive signal Com-B that has a waveform PS. In this embodiment, the potential of the waveform PS changes from a minimum potential VLS to a maximum potential VHS in the control period TSS1 and the maximum potential VHS is maintained in the control period TSS2. In this embodiment, the waveform PS is determined such that the potential difference between the maximum potential VHS and the minimum potential VLS of the waveform PS is smaller than the potential difference between the maximum potential VHY and the minimum potential VLY of the waveform PY. Specifically, to drive the discharge section D[m] by the drive signal Com-B having the waveform PS, the waveform of the waveform PS is determined such that the discharge section D[m] is driven so as not to discharge the ink. The potentials of the waveform PS at the start and at the end are set to the reference potential V0.

FIG. 7 illustrates an example of a relationship among the individual-designating signal Sd[m] and the connection-state designating signals SLa[m], SLb[m], and SLs[m] in the unit period Tu. As illustrated in FIG. 7, in this embodiment, the individual-designating signal Sd[m] is a 3-bit digital signal. Specifically, in each unit period Tu, the individual-designating signal Sd[m] is set to one of five values of a value (1, 1, 0) that designates a discharge (may be referred to as a "formation of a large dot") of the ink of an amount (a large amount) corresponding to a large dot, a value (1, 0, 0) that designates a discharge (may be referred to as a "formation of a medium dot") of the ink of a medium amount, a value (0, 1, 0) that designates a discharge (may be referred to as a "formation of a small dot") of the ink of a small amount, a value (0, 0, 0) that designates a non-discharge of the ink, and a value (1, 1, 1) that designates driving as the determination-target discharge section D-H.

When the individual-designating signal Sd[m] is set to the value (1, 1, 0), which designates the formation of a large dot, the connection-state designating circuit 311 sets the connection-state designating signal SLa[m] to a high level in the unit period Tu, and sets the connection-state designating signals SLb[m] and SLs[m] to a low level in the unit period Tu. In this case, the discharge section D[m] is driven by the drive signal Com-A having the waveform PX and discharges the middle amount of ink in the control period Ts1 and is driven by the drive signal Com-A having the waveform PY and discharges the small amount of ink in the control period Ts2. By these operations, the discharge section D[m] discharges the large amount of ink in total in the unit period Tu, and thereby the large dot is formed on the recording paper P. When the individual-designating signal Sd[m] is set to the value (1, 0, 0), which designates the formation of a medium dot, the connection-state designating circuit 311 sets the connection-state designating signal SLa[m] to a high level in the control period Ts1 and to a low level in the control period Ts2, and sets the connection-state designating signals SLb[m] and SLs[m] to a low level in the unit period Tu. In this case, the discharge section D[m] discharges the medium amount of ink in the unit period Tu, and thereby the medium dot is formed on the recording paper P. When the individual-designating signal Sd[m] is set to the value (0, 1, 0), which designates the formation of a small dot, the connection-state designating circuit 311 sets the connection-state designating signal SLa[m] to a low level in the control period Ts1 and to a high level in the control period Ts2, and sets the connection-state designating signals SLb[m] and SLs[m] to a low level in the unit period Tu. In this case, the discharge section D[m] discharges the small amount of ink in the unit period Tu, and thereby the small dot is formed on the recording paper P. When the individual-designating signal Sd[m] is set to the value (0, 0, 0), which designates a non-discharge, the connection-state designating circuit 311 sets the connection-state designating signal SLa[m], SLb[m], and SLs[m] to a low level in the unit period Tu. In this case, the discharge section D[m] discharges no ink in the unit period Tu, and thereby no dot is formed on the recording paper P.

When the individual-designating signal Sd[m] is set to the value (1, 1, 1), which designates driving as the determination-target discharge section D-H, the connection-state designating circuit 311 sets the connection-state designating signal SLa[m] to a low level in the unit period Tu, sets the connection-state designating signal SLb[m] to a high level in the control periods TSS1 and TSS3 and to a low level in the control period TSS2, and sets the connection-state designating signal SLs[m] to a low level in the control periods TSS1 and TSS3 and to a high level in the control period TSS2. In this case, the discharge section D[m] that is selected as the determination-target discharge section D-H is driven by the drive signal Com-B having the waveform PS in the control period TSS1. Specifically, the piezoelectric element PZ[m] in the discharge section D[m] that has been selected as the determination-target discharge section D-H is deformed by the drive signal Com-B having the waveform PS in the control period TSS1. The deformation causes vibrations in the discharge section D[m] that has been selected as the determination-target discharge section D-H, and the vibrations remain in the control period TSS2. In the control period TSS2, the upper electrode Zu[m] in the piezoelectric element PZ[m] in the discharge section D[m] that has been selected as the determination-target discharge section D-H changes its potential depending on the residual vibrations occurring in the discharge section D[m]. In other words, in the control period TSS2, the upper electrode Zu[m] in the piezoelectric element PZ[m] in the discharge section D that has been selected as the determination-target discharge section D-H provides a potential corresponding to an electromotive force of the piezoelectric element PZ[m] caused by the residual vibrations occurring in the discharge section D[m].

In the control period TSS2, the residual-vibration detection circuit 41 detects the potential of the upper electrode Zu[m] in the discharge section D[m] that has been selected as the determination-target discharge section D-H as the detection signal Vout[m]. Then, the residual-vibration detection circuit 41 removes noise components from the detection signal Vout[m] and increases its amplitude to generate the residual-vibration signal NV[m]. Based on the residual-vibration signal NV[m] generated by the residual-vibration detection circuit 41, the controller 6 determines the discharge state of the ink in the discharge section D[m]. Specifically, the controller 6 determines whether or not the period of the residual-vibration signal NV[m], that is, the period of residual vibration in the discharge section D[m] is within a reference range that is determined in accordance with the characteristic information CI. If the period of the residual-vibration signal NV[m] is within the reference range, the controller 6 determines that the ink-discharge state in the discharge section D[m] is normal, and if the period of the residual-vibration signal NV[m] is beyond the reference range, the controller 6 determines that a discharge abnormality is occurring in the discharge section D[m].

Figure 8:
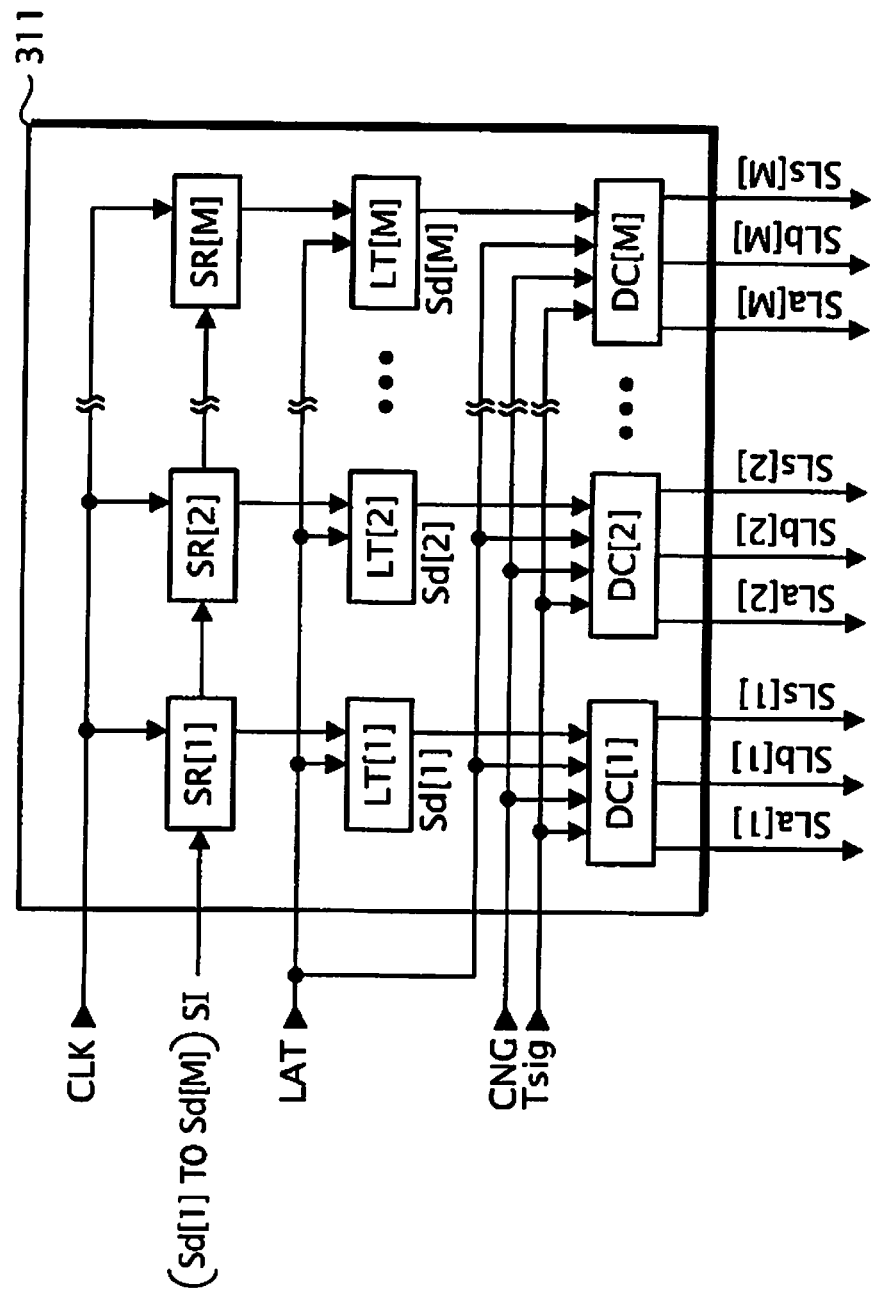
FIG. 8 is a block diagram illustrating a configuration of a connection-state designating circuit.

FIG. 8 illustrates a configuration of the connection-state designating circuit 311 according to the embodiment. As illustrated in FIG. 8, the connection-state designating circuit 311 generates the connection-state designating signals SLa[1] to SLa[M], SLb[1] to SLb[M], and SLs[1] to SLs[M]. Specifically, the connection-state designating circuit 311 includes transfer circuits SR[1] to SR[M], latch circuits LT[1] to LT[M], and decoders DC[1] to DC[M] so as to correspond respectively to the discharge sections D[1] to D[M]. To the transfer circuit SR[m], the individual-designating signal Sd[m] is supplied. In FIG. 8, the individual-designating signals Sd[1] to Sd[M] are serially supplied, for example, the individual-designating signal Sd[m] corresponding to the m stage is transferred from the transfer circuit SR[1] to the transfer circuit SR[m] in the order in synchronization with the clock signal CLK. The latch circuit LT[m] latches the individual-designating signal Sd[m] supplied to the transfer circuit SR[m] when the pulse PlsL of the latch signal LAT rises to the high level. The decoder DC[m] generates the connection-state designating signals SLa[m], SLb[m], and SLs[m] in accordance with the individual-designating signal Sd[m], the latch signal LAT, the change signal CNG, and the period-designating signal Tsig based on the table in FIG. 7.

5. Connection Among Substrates

Figure 9:
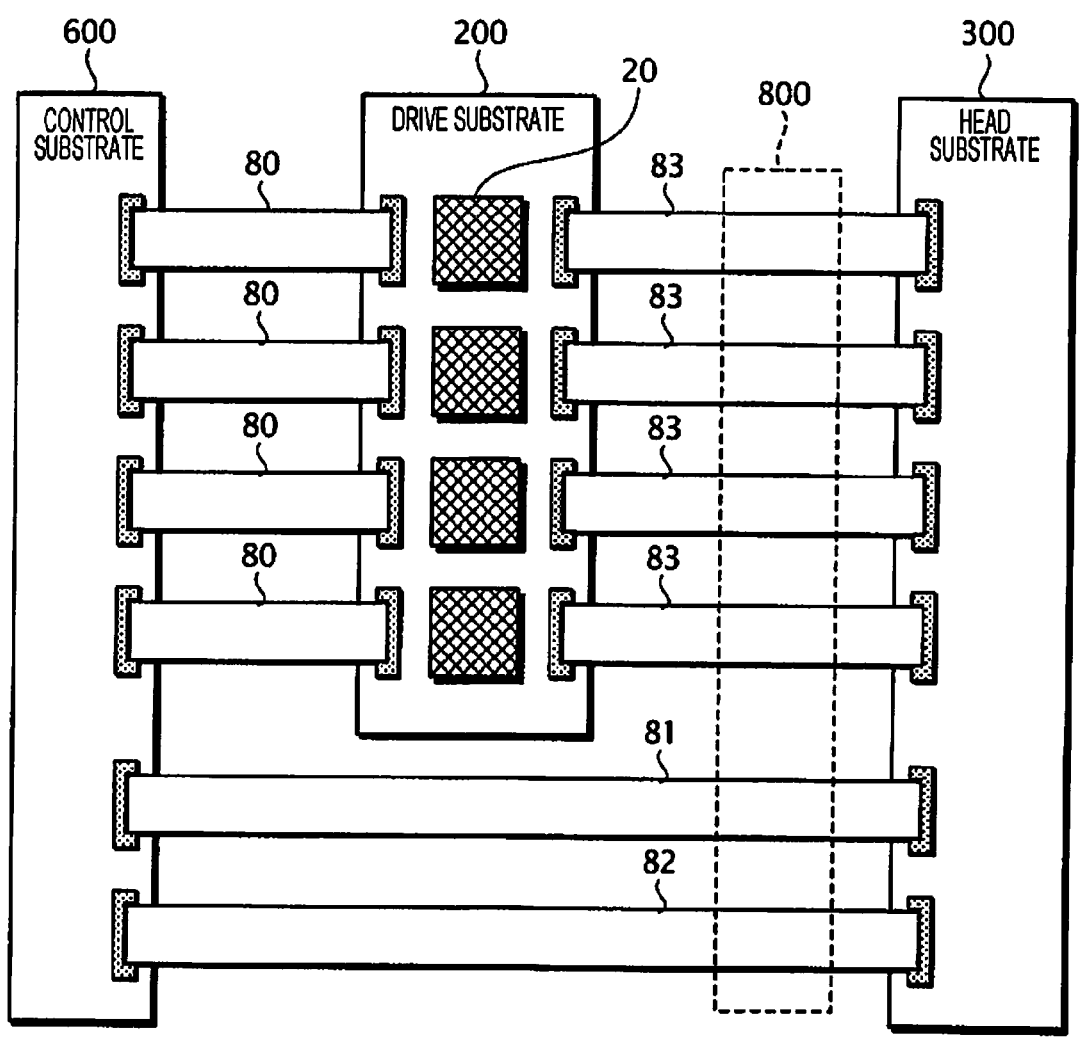
FIG. 9 illustrates connections among substrates.

Hereinafter, with reference to FIG. 9 and FIG. 10, a configuration for electrically interconnecting the controller 6, the drive-signal generation module 2, and the liquid discharge head 3 will be described. In this specification, the "electrical connection" includes not only physical direct connection but also includes indirect connection via a conductive substance, or the like. FIG. 9 illustrates a configuration for electrically interconnecting the controller 6, the drive-signal generation module 2, and the liquid discharge head 3.

As illustrated in FIG. 9, the ink jet printer 1 includes a control substrate 600 on which the controller 6 is provided, a drive substrate 200 on which the four drive-signal generation circuits 20, which are provided in the drive-signal generation module 2, are provided, and a head substrate 300 on which the four drive signal supply circuits 31, the four state-signal output sections 40, and the four characteristic-information storage units 43, which are provided in the liquid discharge head 3, are provided. The ink jet printer 1 further includes four FFCs 80 for electrically connecting the control substrate 600 and the drive substrate 200, an FFC 81 and an FFC 82 for electrically connecting the control substrate 600 and the head substrate 300, and four FFCs 83 for electrically connecting the drive substrate 200 and the head substrate 300.

The controller 6 supplies the waveform specifying signal dCom to the drive-signal generation circuits 20 via the FFCs 80. Furthermore, via the FFC 82, the controller 6 supplies the print signal SI, the clock signal CLK, the latch signal LAT, the change signal CNG, and the period-designating signal Tsig to the head units HU. Each drive-signal generation circuit 20 supplies the drive signal Com to the corresponding head unit HU via the FFC 83. The head unit HU supplies the state signal JS (the residual-vibration signal NV and the overheating-notification signal XH) to the controller 6 via the FFC 81. The controller 6 can refer to the characteristic information CI stored in the characteristic-information storage unit 43 that is provided in the head unit HU via the FFC 81.

FIG. 10 illustrates the FFC 81, the FFC 82, and the FFCs 83.

In this embodiment, as illustrated in FIG. 10, the FFC 81, the FFC 82, and the FFCs 83 are provided so as to be stacked in the thickness direction αH of each FFC in a central part of each FFC except end portions of each FFC for connection to connectors, the end portions that are provided on each substrate. Accordingly, in this embodiment, for example, even if a casing (not illustrated) of the ink jet printer 1 is small and has no sufficient space for wiring of the FFCs, the plurality of FFCs required for driving and determining the state of the liquid discharge head 3 can be provided. In the description below, the portion where the the FFC 81, the FFC 82, and the FFCs 83 are provided so as to be stacked each other is referred to as a wire section 800.

In this embodiment, as illustrated in FIG. 10, in the wire section 800, the FFC 81 is provided between the FFC 82 and the FFC 83. In this embodiment, as an example, it is assumed that the FFC 81, the FFC 82, and the FFCs 83 are provided in the wire section 800 so that the thickness direction αH of each FFC is substantially parallel to the Z-axis direction as illustrated in FIG. 10, that is, the width direction αW of each FFC and the extension direction αL of each FFC are substantially perpendicular to the Z-axis direction. In this embodiment, as illustrated in FIG. 10, it is assumed that the FFC 82 is provided on the +Z side of the FFC 81 and the four FFCs 83 are provided on the −Z side of the FFC 81 in the wire section 800. Furthermore, in this embodiment, as an example, it is assumed that the FFC 81, the FFC 82, and the FFCs 83 are provided such that the distance between the liquid discharge head 3 and the FFC 83 is shorter than the distance between the liquid discharge head 3 and the FFC 81 in the wire section 800. In other words, in this embodiment, the wire section 800 is provided on the +Z side of the liquid discharge head 3. Furthermore, in this embodiment, in the wire section 800, the FFCs are arranged such that the interval δH between two adjacent FFCs in the thickness direction αH is equal to or less than a predetermined interval. With this configuration, in this embodiment, the plurality of FFCs can be provided in a narrow space.

In this embodiment, the FFC 81, the FFC 82, and the FFCs 83 are so-called double-sided shield type FFCs, and each FFC includes a core wire that is a conductor for transmitting various signals, an insulating layer that covers the periphery of the core wire, and conductive shield layers that are provided so as to sandwich the insulating layer in the thickness direction αH.

Specifically, as illustrated in FIG. 10, the FFC 81 includes two shielding layers 813 and 814 that contain a conductive material such as aluminum or gold, a plurality of core wires 811 that are provided between the shielding layers 813 and 814 and contain a conductive material and are used to transmit various signals, and an insulating layer 812 that is provided so as to cover the core wires 811 between the shielding layers 813 and 814 and is composed of an insulating material. The core wires 811 include, for example, a core wire 811 for transmitting the residual-vibration signal NV, a core wire 811 for transmitting the overheating-notification signal XH, and a core wire for transmitting the information concerning the characteristic information CI. The FFC 82 includes two shielding layers 823 and 824 that contain a conductive material such as aluminum or gold, a plurality of core wires 821 that are provided between the shielding layers 823 and 824 and contain a conductive material and are used to transmit various signals, and an insulating layer 822 that is provided so as to cover the core wires 821 between the shielding layers 823 and 824 and is composed of an insulating material. The core wires 821 include, for example, a core wire 821 for transmitting the print signal SI, and a core wire 821 for transmitting the clock signal CLK. The FFC 83 includes two shielding layers 833 and 834 that contain a conductive material such as aluminum or gold, a plurality of core wires 831 that are provided between the shielding layers 833 and 834 and contain a conductive material and are used to transmit various signals, and an insulating layer 832 that is provided so as to cover the core wires 831 between the shielding layers 833 and 834 and is composed of an insulating material. The core wires 831 include, for example, a core wire 831 for transmitting the drive signal Com-A, and a core wire 831 for transmitting the drive signal Com-B.

As described above, in the wire section 800, the FFC 81, the FFC 82, and the FFCs 83 are provided so as to be stacked in the thickness direction αH. Consequently, between the core wires 811 and the core wires 831, the shielding layer 814 and the shielding layer 833 are provided, and between the core wires 811 and the core wires 821, the shielding layer 813 and the shielding layer 824 are provided. With this configuration, in the wire section 800, even if the FFC 81, the FFC 82, and the FFCs 83 are to be provided such that the interval δH between the two adjacent FFCs in the thickness direction αH is equal to or less than the predetermined interval, interference can be prevented among the signals that are transmitted by the core wires 811 such as the residual-vibration signal NV and the overheating-notification signal XH, the signals that are transmitted by the core wires 821 such as the print signal SI and the clock signal CLK, and the signals that are transmitted by the core wires 831 such as the drive signal Com.

6. Conclusion of Embodiment

As described above, in this embodiment, the double-sided shield type FFC is used as the FFC 81, and consequently, superimposition of the noise caused by the drive signal Com or the like on the state signal JS such as the residual-vibration signal NV and/or the overheating-notification signal XH transmitted by the FFC 81 can be prevented. Consequently, the ink jet printer 1 according to this embodiment can accurately determine the state of the liquid discharge head 3.

In this embodiment, in the wire section 800, the FFC 81, the FFC 82, and the FFCs 83 are stacked such that the interval δH in the thickness direction αH is equal to or less than the predetermined interval. With this configuration, even if the ink jet printer 1 is small and has only a narrow space in the casing of the ink jet printer 1, the plurality of FFCs can be provided. Since the FFC 81, the FFC 82, and the FFCs 83 are double-sided shield type FFCs, even if the FFCs are stacked in the narrow space, the interference among the signals that are transmitted by the FFCs can be prevented.

In this embodiment, the core wires 811 that transmit the state signal JS are an example of a "first conductor", the FFC 81 that includes the core wires 811 is an example of a "first wire", and the shielding layers 813 and 814 in the FFC 81 are examples of a "first shielding layer" and a "second shielding layer", respectively. In this embodiment, the print signal SI that designates whether or not to supply the drive signal Com to the discharge sections D is an example of a "designation signal", the core wires 821 that transmit the print signal SI are an example of a "second conductor", the FFC 82 that includes the core wires 821 is an example of a "second wire", and the shielding layers 823 and 824 in the FFC 82 are examples of a "third shielding layer" and a "fourth shielding layer", respectively. In this embodiment, the core wires 831 that transmit the drive signal Com are an example of a "third conductor", the FFC 83 that includes the core wires 831 is an example of a "third wire", and the shielding layers 833 and 834 in the FFC 83 are examples of a "fifth shielding layer" and a "sixth shielding layer", respectively.

B. Modifications

The above-described embodiment may be modified in various ways. Specific modifications will be described below. Two or more modifications selected from those below may be combined without a contradiction between them. In the modifications described below, the reference numerals used in the above description will be used to components that operate or serve similarly to those in the embodiment, and detailed descriptions of the components will be omitted.

Modification 1

In the above-described embodiment, the head unit HU includes the residual-vibration detection circuit 41 and the overheating-information detection circuit 42; however, the invention is not limited to this example, and the head unit HU may include at least one of the residual-vibration detection circuit 41 and the overheating-information detection circuit 42. In other words, in the above-described embodiment, the state signal JS includes the residual-vibration signal NV and the overheating-notification signal XH; however, the invention is not limited to this example, the state signal JS may include at least one of the residual-vibration signal NV and the overheating-notification signal XH.

In the above-described embodiment, the head unit HU includes the characteristic-information storage unit 43; however, the invention is not limited to this example, the head unit HU may omit the characteristic-information storage unit 43.

Modification 2

In the above-described embodiment and modification, the range YP is 297 mm or greater and the liquid discharge head 3 is provided with the nozzles N that are arranged so as to extend within the range YNL of 297 mm or greater; however, the invention is not limited to this example, and the range YP may be less than 297 mm. In this case, the liquid discharge head 3 may be provided with the nozzles N such that the nozzles N extend in a range that covers the range YP.

In the above-described embodiment and the modification, the liquid discharge head 3 is provided with the nozzles N that are arranged such that printing can be performed at a dot density of 600 dpi or greater; however, the invention is not limited to this example, and the liquid discharge head 3 may be provided with the nozzles N that are arranged so as to enable printing only at a dot density less than 600 dpi.

Modification 3

In the above-described embodiment and modifications, in the wire section 800, the FFC 81, the FFC 82, and the FFCs 83 are provided such that the thickness direction of each FFC is substantially parallel to the Z-axis direction; however, the invention is not limited to this example, and in the wire section 800, the thickness direction of each FFC may be any direction.

Modification 4

In the above-described embodiment and modifications, the FFC 81, the FFC 82, and the FFCs 83 are double-sided shield type FFCs; however, the invention is not limited to this example, and at least the FFC 81 may be a double-sided shield type FFC and the FFC 82 and the FFCs 83 may be FFCs of type other than the double-sided shield type. In this case, it is preferable that the FFC 82 be a one-sided shield type FFC that includes a shielding layer 824 that faces the FFC 81, and the FFC 83 be a one-sided shield type FFC that includes a shielding layer 833 that faces the FFC 81.

Modification 5

In the above-described embodiment and modifications, it is assumed that the ink jet printer 1 is a line printer; however, the invention is not limited to this example, and the ink jet printer 1 may be a so-called serial printer that performs print processing while moving the liquid discharge head 3 in the Y-axis direction.

Modification 6

In the above-described embodiment and modifications, the liquid discharge head 3 is provided with the four head units HU; however, the invention is not limited to this example, and the liquid discharge head 3 may be provided with one or more head units HU.

Furthermore, in the above-described embodiment and modifications, in the drive-signal generation module 2, the drive-signal generation circuits 20 and the head units HU correspond to each other in a one-to-one relationship; however, the invention is not limited to this example, and in the drive-signal generation module 2, two or more drive-signal generation circuits 20 may be provided for one head unit HU, or one drive-signal generation circuit 20 may be provided for two or more head units HU.

Furthermore, in the above-described embodiment and modifications, the ink jet printer 1 includes the FFCs 83 and the drive-signal generation circuits 20 that correspond to each other in a one-to-one relationship; however, the invention is not limited to this example, and in the ink jet printer 1, two or more drive-signal generation circuits 83 may be provided for one drive-signal generation circuit 20, or one FFC 83 may be provided for two or more drive-signal generation circuits 20.

Modification 7

In the above-described embodiment and modifications, the controller 6 is provided on the control substrate 600 and the drive-signal generation circuits 20 in the drive-signal generation module 2 are provided on the drive substrate 200; however, the invention is not limited to this example, and the controller 6 and the drive-signal generation circuits 20 may be provided on the same substrate.

What is claimed is:

1. A liquid discharge apparatus comprising:
   a liquid discharge head including:
      a head module provided with a discharge section configured to be driven by a drive signal and discharge a liquid and a supply section configured to supply the drive signal to the discharge section in accordance with a designation signal for designating an operation in the discharge section; and
      a state-signal output section configured to output a state signal indicating a state of the head module; and
   a wire section including:
      a first wire to which the state signal is supplied from the liquid discharge head;
      a second wire configured to supply the designation signal to the liquid discharge head; and
      a third wire configured to supply the drive signal to the liquid discharge head,
   wherein the first wire includes:
      a first shielding layer containing a conductive material;
      a second shielding layer containing a conductive material; and
      a first conductor provided between the first shielding layer and the second shielding layer, the first conductor being configured to transmit the state signal.

2. The liquid discharge apparatus according to claim 1, wherein the first shielding layer is provided between the first conductor and the second wire in the wire section, and the second shielding layer is provided between the first conductor and the third wire in the wire section.

3. The liquid discharge apparatus according to claim 1, wherein the state signal includes a residual vibration signal indicating residual vibrations occurring in the discharge section driven by the drive signal.

4. The liquid discharge apparatus according to claim 1, wherein the state signal includes an overheating-notification signal indicating whether or not the temperature of the head module at a predetermined position is a reference temperature or higher.

5. The liquid discharge apparatus according to claim 1, wherein the second wire includes a third shielding layer containing a conductive material, a fourth shielding layer containing a conductive material, and a second conductor provided between the third shielding layer and the fourth shielding layer, the second conductor being configured to transmit the designation signal.

6. The liquid discharge apparatus according to claim 1, wherein the third wire includes a fifth shielding layer containing a conductive material, a sixth shielding layer containing a conductive material, and a third conductor provided between the fifth shielding layer and the sixth shielding layer, the third conductor being configured to transmit the drive signal.

7. The liquid discharge apparatus according to claim 1, further comprising:
- a controller configured to control the liquid discharge head,
- wherein the liquid discharge head includes a characteristic-information storage unit configured to store characteristic information indicating characteristics of the liquid discharge head, and
- the controller references the characteristic information stored in the characteristic-information storage unit via the first wire.

8. The liquid discharge apparatus according to claim 2, wherein in the wire section, the distance between the liquid discharge head and the third wire is shorter than the distance between the liquid discharge head and the first wire.

\* \* \* \* \*